United States Patent
Eser et al.

(10) Patent No.: US 8,179,036 B2
(45) Date of Patent: May 15, 2012

(54) LIGHT EMITTING DEVICE WITH A SHUNT

(75) Inventors: Juergen Eser, Titz (DE); Edward Willem Albert Young, Eindhoven (NL); Johannes Krijne, Best (NL); Arie Van Der Van Der Padt, Maastricht (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 198 days.

(21) Appl. No.: 12/523,167

(22) PCT Filed: Jan. 17, 2008

(86) PCT No.: PCT/IB2008/050167
§ 371 (c)(1),
(2), (4) Date: Jul. 15, 2009

(87) PCT Pub. No.: WO2008/090493
PCT Pub. Date: Jul. 31, 2008

(65) Prior Publication Data
US 2010/0109513 A1  May 6, 2010

(30) Foreign Application Priority Data
Jan. 22, 2007 (EP) .................................. 07100924

(51) Int. Cl.
*H01L 51/00* (2006.01)

(52) U.S. Cl. ........................................ 313/504; 313/506
(58) Field of Classification Search .................. 313/504, 313/506
See application file for complete search history.

(56) References Cited

U.S. PATENT DOCUMENTS

| 6,525,467 | B1 | 2/2003 | Eida et al. | |
| 2005/0248266 | A1 | 11/2005 | Hosokawa | |
| 2007/0079869 | A1* | 4/2007 | Yukinobu | 136/263 |
| 2007/0264899 | A1* | 11/2007 | Kumagai | 445/24 |

FOREIGN PATENT DOCUMENTS

| JP | 2003045674 | A | | 2/2003 |
| JP | 2003123990 | A | | 4/2003 |
| JP | 2005267991 | A | * | 9/2005 |
| WO | 2005053053 | A1 | | 6/2005 |
| WO | 2006064443 | A2 | | 6/2006 |
| WO | 2007008946 | A2 | | 1/2007 |
| WO | 2007115651 | A1 | | 10/2007 |

* cited by examiner

*Primary Examiner* — Karabi Guharay
(74) *Attorney, Agent, or Firm* — Dicran Halajian; Mark Beloborodov

(57) ABSTRACT

A light emitting device includes a stack of layers having a basic layer, a first electrode layer and a second electrode layer. An organic light-emitting layer is sandwiched between the first and second electrode layers. At least one shunt element has a connection-end and a free-end. The connection-end is connected with one of the electrode layers, and the free-end is jutting out of the stack of layers.

5 Claims, 2 Drawing Sheets

LIGHT EMITTING DEVICE WITH A SHUNT

FIELD OF THE INVENTION

This invention relates to a light emitting device and a method to manufacture such a device.

BACKGROUND OF THE INVENTION

To generate a favorable climate in a room large area illumination devices are needed. Nowadays often gas discharge lamps are used to generate a homogeneous light, illuminating large parts of the room. Unfortunately, discharge lamps are known to be costly and quite inefficient. To overcome this disadvantage, the use of organic light emitting diodes (OLED) is appropriate. The advantage of the OLED is that it is a homogeneous light source with potentially low costs and high efficiency. Organic light emitting devices (materials and structures) are known in the art, for instant as disclosed in WO2005/053053 A1, the disclosure of which is incorporated herein by reference for all purposes.

However, large size OLEDs suffers the problem of brightness inhomogeneity. The brightness inhomogeneity is due to the fact that the OLEDs comprise thin film electrodes, with a thickness of around a few hundred nm. Therefore, the thin film electrodes have a relative high sheet resistance. As OLEDs are driven at low voltage and high currents, the high sheet resistance results in a voltage drop along the electrodes, causing the brightness inhomogeneity. This disadvantage is getting worse with increasing OLED size.

SUMMARY OF THE INVENTION

The invention has for its object to eliminate the above mentioned disadvantages. In particular it is an object to the invention to provide a large size OLED with a homogeneous brightness and a method to manufacture such a device.

The object is achieved by a light-emitting device as taught by claim 1 of the present invention. Advantage embodiments of the light-emitting device are defined in the sub-claims.

The object of the invention is achieved by a light emitting device comprising a stack of layers comprising a basic layer, a first electrode layer and a second electrode layer, wherein an organic light-emitting layer is sandwiched between the first and the second electrode layer, with at least one shunt element, comprising a connection-end and a free-end, wherein the connection-end is connected with one of the electrode layers, and wherein the free-end is jutting out of the stack of layers.

The leading thought of the invention is the use of at least one shunt element, comprising a larger cross-section than the electrode layer, with which it is connected, and therefore comprising a low sheet resistance. Due to this advantage, the shunt element can transport the needed current to all parts of the OLED, so that a homogeneous brightness is achieved.

The light-emitting device comprises a basic layer, serving as a carrier, which may be made of glass or organic material or from non-transmittive material such as metal foils. Onto this basic layer usually a thin layer of a transparent Indium Tin Oxide (ITO) is applied, forming the first electrode layer. Furthermore, organic light emitting diodes consists of at least one thin layer, with a layer thickness of approximately 5 to 500 nm of organic substances. The OLED is regularly covered with a layer of metal, like aluminum, forming the second electrode layer, whereas the metal layer features a thickness of approximately 100 nm and thus a thickness like the ITO-layer. Aluminum of such a thickness works as a mirror, such that the emission is through the transparent ITO first electrode layer and the transparent basic layer only. Unfortunately, the specific resistance of ITO is approximately two orders of magnitude higher than the specific resistance of aluminum. Therefore, the flow of the current in the first electrode layer is highly attenuated. To overcome this disadvantage, the first electrode layer may be connected with the shunt element.

In the context of the invention, the term organic light-emitting layer comprises a single layer of an organic material as well as an element, build of several layers, comprising organic and inorganic material.

Thin electrode layers used in OLED devices show a sheet resistance leading to a voltage drop across the electrode area, especially for large OLED devices leading to an inhomogeneous brightness distribution. This effect mainly occurs for the second electrode, but also for the first electrode. To overcome this disadvantage, a first preferred embodiment of the light emitting device comprises a first shunt element, connected with the first electrode layer and a second shunt element, connected with the second electrode layer. So both electrode layers, embedded in the light-emitting device, are connected with one shunt element each.

The shunt element may be a foil like element, being connected with one of the electrode layers. The connection can be done through different methods achieving an electrical connection between the electrode layer and a shunt element, wherein the connection comprises a low transfer resistance. For example this aim can be achieved by gluing or welding the foil like shunt element to the electrode layer. Especially, laser welding, heat sealing, resistant welding or electron beam welding have shown to be advantageous. Apart from this merging, the shunt element can be produced by thin film deposition techniques, such as ion beam deposition, electron beam deposition, chemical vapor deposition, thermal evaporation, plasma beam deposition, sputter deposition and galvanic deposition. As described above the main idea of the invention is the use of a huge shunt element, supporting the electrode layer in the transport of the current. Therefore, the size of the shunt element should be large compared to the electrode layer. In a preferred embodiment, the shunt element comprises a width between 50 µm to 4 mm, preferably between 100 µm to 2 mm, and a height between 20 µm to 800 µm, preferably between 50 µm to 500 µm. Compared with the sheet thicknesses of the electrode layers, the height of the shunt element is up to three orders of magnitude larger. Thus, the sheet resistance is greatly reduced by distributing the current mainly via the shunt elements. The remaining voltage drop across the small electrode areas between the shunt elements is negligible. To enhance this effect, it is preferably, that the shunt element comprises a high electrical conductivity, which is preferably higher than $30 \times 10^6$ S/m. The shunt element may be a metal selected from Group III or IB metals and transition metals such as silver, gold, copper, aluminum, tungsten, molybdenum, chromium, and the like. Combinations and alloys of these metals are very suitable, such as molybdenum chrome/aluminum/molybdenum chrome (MAM).

Due to the large size the shunt element is not embedded in the stack of layers, but sticks out of the plane of the stack of layers. It is therefore visible and may even be palpable above the surface of the other layers. As the electrode layer, most distant from the basic layer, may be covered with a protection layer, last named layer may also cover the shunt element. As the name says, the protection layer's assignment is to protect the stack of layers, building the OLED. Therefore, it is appropriate, that the protection layer may comprise a combination of a metal and/or an isolating polymer. The thickness of this protection layer varies and depends on the type of use for the light-emitting device.

In a preferred embodiment a metallization element is connected with one of the electrode layers, wherein the metallization element is sandwiched between the electrode layer and the connection-end of the shunt element. Thus, the metallization element acts like a shunt itself, being embedded in the stack of layers. Due to its size, the metallization element itself would not overcome the disadvantages mentioned above. Rather than for the transport of the current, the purpose of the metallization element is that of a connector between the shunt element and the electrode layer. Preferably, the shunt element has a rectangle cross-section, so that the whole underside is labeled the connection-end. The thickness of the metallization element is depending on its main purpose as a connector to the shunt layer. In a preferred embodiment of the described invention, the metallization element comprises a layer thickness of 1 nm to 100 nm. To deposit the metallization element, thin film depositing techniques as those named above may be used.

In another preferred embodiment the metallization element and the shunt element are connected by solid-state welding. The most popular type of solid-state welding, ultrasonic welding, has shown to be preferable. Nevertheless also other solid-state welding processes, including co-extrusion welding, cold welding, diffusion welding, friction welding, high frequency welding, hot pressure welding, induction welding, and roll welding, have shown to be appropriate. The optional metallization element may comprise a metal such as silver, gold, copper, aluminum, tungsten, molybdenum, chromium, and the like. Also combinations and alloys of these metals are very suitable, such as molybdenum chrome/aluminum/molybdenum chrome (MAM).

In another preferred embodiment of the invention, the shunt element and/or the metallization element are patterned. The term patterned in the context of the invention means that either the shunt element or a combination of the shunt element with the metallization element is arranged in a constant way on the stack of layers. For very large area OLEDs it may for example be useful that the shunt element builds a net like structure, overlying the surface of the stack of layers. Aim of this patterned arrangement of the named elements is to achieve a homogeneous flow of current through all parts of the electrode layers of the light-emitting device. It can be appropriate that the shunt element has a comb like structure, whereas those shunt elements, defining the teeth of the comb extend into the surface of the light-emitting device. Furthermore, the shunt element may be arranged in a U-, V- and/or L-style. The chosen kind of configuration is mostly depending on the overall structure of the light-emitting device. If the last named possesses a circular surrounding, the shunt elements may be arranged in a star like pattern. Due to the invention each of the pie slice-like formed segments obtain sufficient current to generate a homogeneous brightness.

The patterned assembly of the shunt element is supported by another preferred embodiment of the invention, which is characterized in that the first electrode layer, the second electrode layer and the organic light-emitting layer form a lighting tile, wherein a plurality of lighting tiles are deposited on one basic layer. The idea behind this embodiment is to divide a very large OLED in smaller, tile like sections. But all those separated lighting tiles are altogether deposited on one basic layer. Therefore, even very large light emitting devices are easy to handle and there is no danger of a fragmentation in single lighting tiles. Preferably, the lighting tile comprises a size between 20 mm×20 mm to 250 mm×250 mm, preferably between 30 mm×30 mm to 150 mm×150 mm, preferably between 40 mm×40 mm to 80 mm×80 mm.

To achieve a homogeneous brightness of the light-emitting device a homogeneous flow of current through all electrode layers respectively organic light-emitting layer is necessary. Therefore the lighting tiles are partially isolated against one another. Thus, the combination of the shunt elements with the lighting tiles enables the steady and huge flow of current through smaller subsections of a large light emitting device, and therefore ensuring the homogeneous brightness.

In another embodiment the shunt element, connected with a first electrode layer, encloses a rectangular lighting tile from three sides, whereas the shunt element, connected with the second electrode layer, borders the lighting tile from one side. In most commonly known OLEDs the first electrode layer consists of ITO, which—as has been mentioned—has a two order of magnitude higher specific resistance than aluminum, mostly used for the second electrode layer. Due to this resistance and the fact that the sheet height of the first and the second electrode layer are mostly more or less identical, the voltage drop along the first electrode layer is far more severe than along the second electrode layer. To achieve a homogeneous flow of current in this embodiment of an OLED, it is appropriate to mainly encircle the lighting tile with a shunt element, being connected to the first electrode layer. The second electrode layer may than be connected to a shunt element bordering a last open side of the lighting tile.

The present invention also relates to a method to manufacture a light-emitting device according to claim 1 comprising the step gluing or welding the at least one shunt element to the electrode layer. In a preferred embodiment the welding is at least one of the following group of laser welding, heat sealing, resistance welding, electron beam welding or solid-state-welding, preferably ultrasonic welding.

The aforementioned light emitting device, as well as claimed components and the components to be used in accordance with the invention in the described embodiments, are not subject to any special exceptions with respect to size, shape, or material selection. Technical concepts known in the pertinent field can be applied without limitations. Additional details, characteristics and advantages of the object of the present invention are disclosed in the sub-claims and the following description of the respective figures—which are an exemplary fashion only—shows a preferred embodiment of the light emitting device according to the present invention.

DETAILED DESCRIPTION OF THE DRAWINGS

Figure 1:
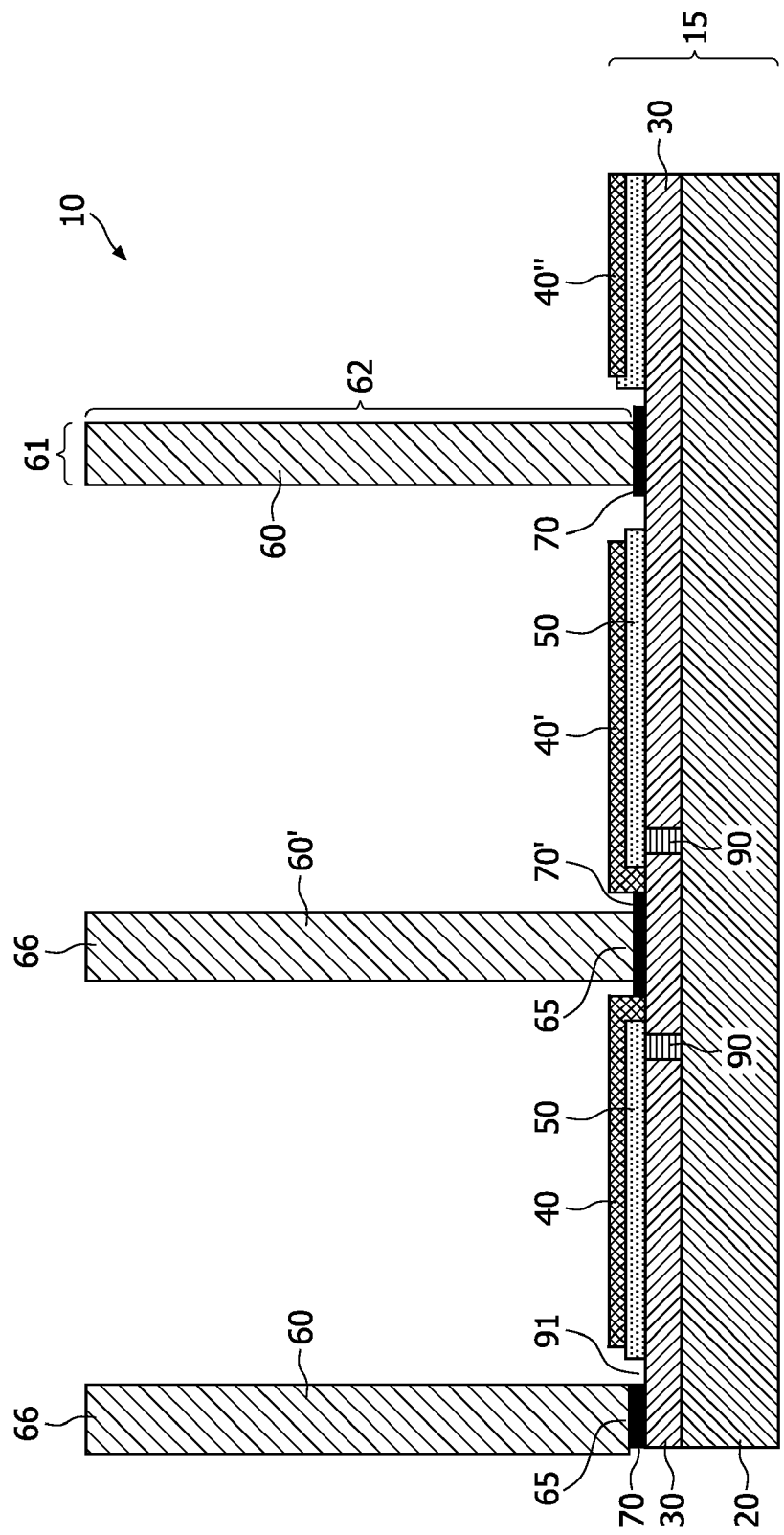
FIG. 1 shows a cross-section through a light emitting device.

In FIG. 1 a cross-section of a light-emitting device 10 is shown. The light-emitting device 10 comprises a stack of layers 15 with a basic layer 20, e.g. a glass or a polymer substrate. Deposited onto this basic layer 20 is a first electrode layer 30. Above this first electron layer 30 an organic light-emitting layer 50 and a second electrode layer 40, 40', 40" are superimposed onto one another. Each of the three named layers 30, 40, 50 comprises a thickness of less than 500 nm, preferably about 50 nm to 200 nm. Upon application of an electrical current, flowing from the second electrode layer 40, 40', 40" to the first electrode layer 30, the organic light-emitting layer 50 radiates light by recombination of electrons and holes in the organic material. In case of a metal second electrode 40, 40', 40" acting as a mirror, the emitted light radiates through the transparent first electrode layer 30 and the basic layer 20. In case of a transparent second electrode, the light is emitted also through the second electrode to the non-substrate side of the OLED.

As the light-emitting device 10 is driven at low voltages and high currents, the thin film first electrode layer 30 and second electrode layer 40 have a high sheet resistance. So due to this high sheet resistance in combination with the high current, a voltage drop along the electrode layers occur, resulting in a brightness inhomogeneity, which is getting worse with increasing size of the light emitting device 10. To overcome this disadvantage, the invention proposes to use at least one shunt element 60, 60'. The shunt element 60, 60' comprises a connection-end 65 and a free-end 66. The connection-end 65 of the shunt element 60, 60' is connected with one of the electrode layers 30, 40. The free-end 66, positioned opposite to the connection-end 65, is protruding out of the stack of layers 15. In an alternative embodiment, the connection-end 65 reaches into the layer stack 15, as shown in FIG. 1. In other embodiments, the connection end of the shunt element 60, 60'can be arranged at the same height as the second electrode 40, 40', 40" or above or on top of the second electrode 40, 40', 40".

In one embodiment a first shunt element 60 is connected with the first electrode layer 30, whereas a second shunt element 60' is connected with the second electrode layer 40. So both electrode layers are in connection with a shunt element 60, 60', which make the needed current available. Depending on this current, the geometric and size of the shunt elements can vary. Preferably the shunt element 60, 60' will comprise a rectangle cross-section, as shown in FIG. 1. Also circular, triangular or hexagonal cross-sections are appropriate. If sheet like shunt elements 60, 60' are used it is preferably, that they comprise a width 61 between 50 µm to 4 mm and a height 62 between 20 µm to 800 µm. So in contrast to the shown sheet like shunt element 60, 60' the width 61 may be larger than the height 62.

To ease the connection of the shunt element 60, 60' with the first and second electrode layers 30, 40, respectively, a metallization element 70, 70' is enclosed between the electrode layers 30, 40 and the connection-end 65 of the shunt element 60, 60'. The second shunt element 60' is connected through the metallization element 70' with the two second electrode layers 40, 40'. The second electrode layer 40" is connected with another—not shown—shunt element 60'. To prevent a short circuit, no direct contact between the first 30 and the second electrode layer 40 is allowed. Therefore, an isolation mean 90 is embedded in the stack of layers 15. The isolation mean 90 prevents a direct current flow from the second electrode layer 40, 40' to the first electrode layer 30. In fact the current has to flow through the organic light-emitting layer 50, generating the desired light.

The shunt element 60 is connected to the first electrode layer 30. To prevent a short circuit, between the second electrode layers 40, 40' and the shunt element 60, a gap 91 in the stack of layers 15 is embedded. This gap 91 may be filled with an isolation layer, not shown in this embodiment. The isolation layer may not only cover the gap 91, but also the whole stack of layers 15, including the shunt elements 60, 60'.

The main purpose of the metallization element 70, 70' is the support of the connection of the shunt element 60, 60' to the first and second electrode layers 30, 40, respectively. Therefore it is appropriate, that the metallization element 70, 70' is in the area of the electrode layers 30, 40. Even smaller heights, well down to just a few nm, have shown appropriate for ultrasonic welding of the metallization element 70, 70' with the shunt element 60, 60'. If no metallization element 70, 70' is used, the shunt element 60, 60' may be directly glued to the electrode layers 30, 40. Also thin film depositing techniques may be used to implement the shunt element 60, 60' into the stack of layers 15.

Figure 2:
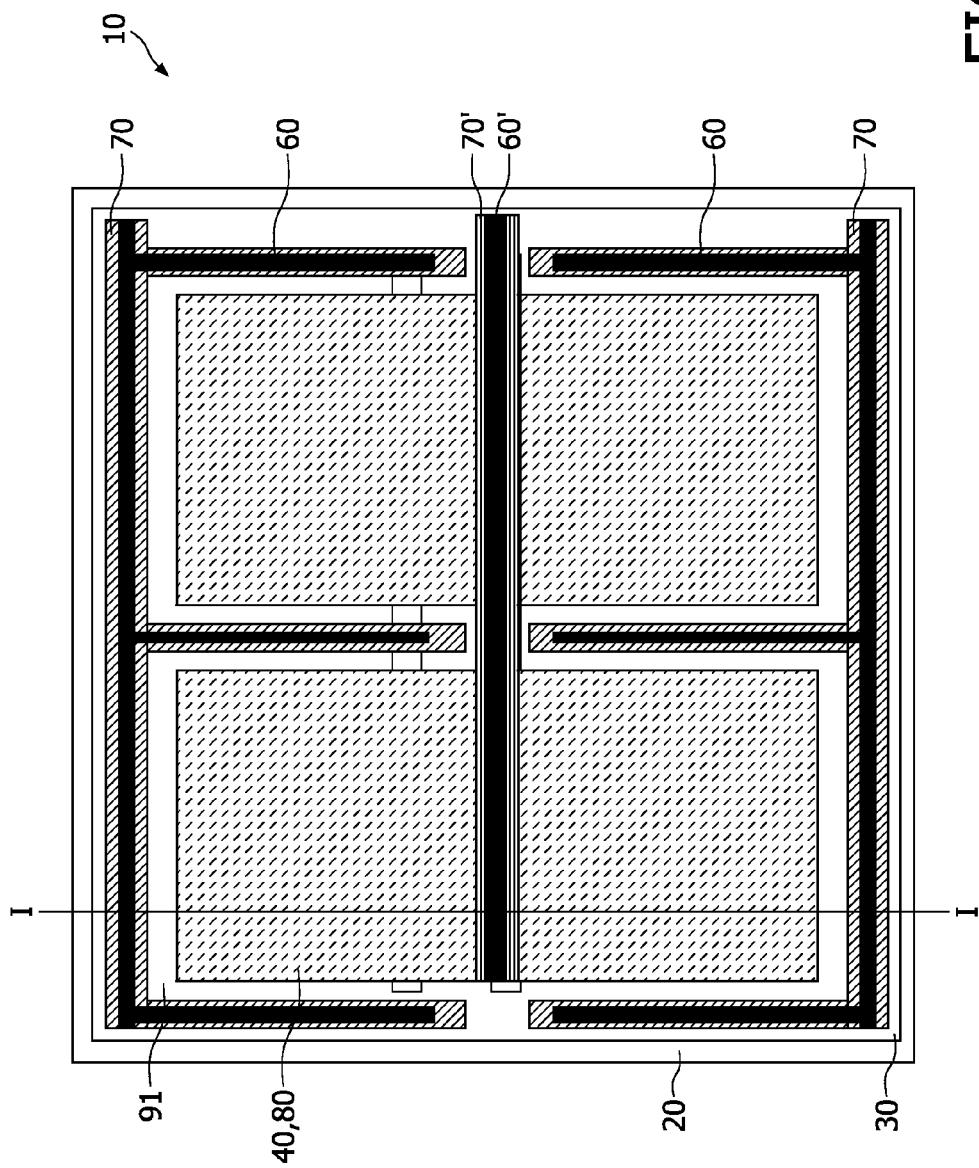
FIG. 2 shows an oversight of the light emitting device.

FIG. 2 shows an oversight of the light-emitting device 10, with the intersection line I-I for the cross-section shown in FIG. 1. As the light-emitting device 10 is build out of a stack of layers 15, just the top level second electrode layer 40 can be seen, above the basic layer 20. In the shown embodiment the shunt element 60, 60' comprises a patterned arrangement. Onto the first electrode layer 30 the metallization element 70, 70' is deposited. With this metallization element 70, 70' the shunt element 60, 60' is connected. The shunt element 60 being connected with the first electrode layer 30 comprise a comb like structure, whereas the shunt element 60', connected with the second electrode layer 40, comprise a line like structure. As has been shown in FIG. 1, between the second electrode layer 40 and the shunt element 60 an isolation gap 91 is embedded in the stack of layers 15. Furthermore, the second electrode 40 is connected with the line like shunt element 60'. In combination with the comb like arrangement of the shunt element 60 rectangular lighting tiles 80 are established. These lighting tiles 80 comprise a cut-out of the light emitting device 10, comprising the first electrode layer 30, the second electrode layer 40 and the organic light-emitting layer 50. In the shown embodiment the four light tiles 80 are all embedded on one basic layer 20, thereby increasing the mechanical stability of the light-emitting device 10.

LIST OF NUMERALS 10 light emitting device
15 stack of layers
20 basic layer,
30 first electrode layer
40,40',40" second electrode layer
50 organic light-emitting layer
60,60' shunt element
61 width of shunt element 60,60'
62 height of shunt element 60,60'
65 connection-end
66 free-end
70,70' metallization element
80 lighting tile
90 isolation mean
91 isolation gap

The invention claimed is:

1. A light-emitting device, comprising:
a basic layer;
a first electrode layer formed over the basic layer;
an organic light-emitting layer formed over the first electrode;
a second electrode layer formed over the organic light-emitting layer so that the organic light-emitting layer is disposed between the first and second electrode layers; and
at least one shunt element comprising a connection-end connected to one electrode layer of the first and second electrode layers,
wherein the at least one shunt comprises a first shunt element connected to the first electrode layer and a second shunt element connected to the second electrode layer,
wherein the first shunt element comprises a comb-like structure and the second shunt element comprises a line-like structure, and wherein the first shunt element and the second shunt element jut out beyond the first electrode layer and the second electrode layer.

2. The light-emitting device according to claim 1, wherein the at least one shunt element has a width ranging from about 50 μm to about 4 mm, and a height ranging from about 20 μm to about 800 μm.

3. The light-emitting device according to claim 1, wherein the at least one shunt element has an electrical conductivity higher than $30\times10^6$ S/m.

4. The light-emitting device according to claim 1, further comprising a metallization element connected with the one electrode layer of the first and second electrode layers and disposed between the one electrode layer and the connection-end of the at least one shunt element.

5. The light-emitting device according to claim 4, wherein the metallization element has a thickness of 1 nm to 100 nm.

* * * * *